US 6,593,742 B1

(12) United States Patent
Conolly et al.

(10) Patent No.: US 6,593,742 B1
(45) Date of Patent: Jul. 15, 2003

(54) BIPLANAR HOMOGENEOUS FIELD ELECTROMAGNETS AND METHOD FOR MAKING SAME

(75) Inventors: Steven M. Conolly, Palo Alto, CA (US); Patrick N. Morgan, College Station, TX (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/515,254

(22) Filed: Feb. 29, 2000

Related U.S. Application Data

(63) Continuation-in-part of application No. 09/289,528, filed on Apr. 9, 1999, now Pat. No. 6,208,143.
(60) Provisional application No. 60/081,311, filed on Apr. 10, 1998.

(51) Int. Cl.$^7$ .................................................. G01V 3/00
(52) U.S. Cl. ......................................... 324/318; 324/309
(58) Field of Search ................................ 324/309, 307, 324/314, 300, 318; 335/299, 216

(56) References Cited

U.S. PATENT DOCUMENTS

| | | | |
|---|---|---|---|
| 4,829,252 A | 5/1989 | Kaufman | 324/309 |
| 4,906,931 A | 3/1990 | Sepponen | 324/309 |
| 5,057,776 A | 10/1991 | Macovski | 324/309 |
| 5,629,624 A | 5/1997 | Carlson et al. | 324/309 |

OTHER PUBLICATIONS

G.E. Lee–Whiting, "Atomic Energy of Canada Limited Chalk River Project Research and Development" Uniform Magnetic Fields, CRT–673, Atomic Energy of Canada Limited, Chalk River, Ontario, Dec. 1958.

M.W. Garrett, "Thick Cylindrical Coil Systems for Strong Magnetic Fields with Field or Gradient Homogeneities of the $6^{th}$ to $20^{th}$ Order" Journal of Applied Physics, No. 6, vol. 38, pp. 2563–2586, Feb. 13, 1967.

*Primary Examiner*—Edward Lefkowitz
*Assistant Examiner*—Brij B. Shrivastav
(74) *Attorney, Agent, or Firm*—Lumen Intellectual Property Services, Inc.

(57) ABSTRACT

The present invention provides biplanar, symmetrical electromagnets for providing a homogeneous magnetic field. The magnets have coils disposed in two parallel planes. The coils in the two planes are identical. The radii and Ampere-turns of the coils are selected so that a magnetic field between the planes is homogeneous. One preferred embodiment has 6 coils, with 3 coils in each plane. Other embodiments have 8, 10, 10, 12, or more coils. The method of making the coils begins with an equation for the spherical harmonic coefficients describing the fields from a coil as a function of radius, position and Ampere-turns. For a magnet with K coils, the first K–1 even spherical harmonic coefficients are set equal or close to zero (the odd coefficients are zero due to symmetry of the magnet). This produces a set of equations that, when solved, provides the radii, positions, and Ampere-turns of the K coils. The method can be used to design a biplanar, symmetrical electromagnet with any even number of coils. In an alternative method, fewer than K–1 spherical harmonic coefficients are constrained. In a preferred embodiment, other constraints are used such as constraints on magnetic field efficiency, power consumption, magnet size, inductance or coil conductor volume are used.

47 Claims, 6 Drawing Sheets

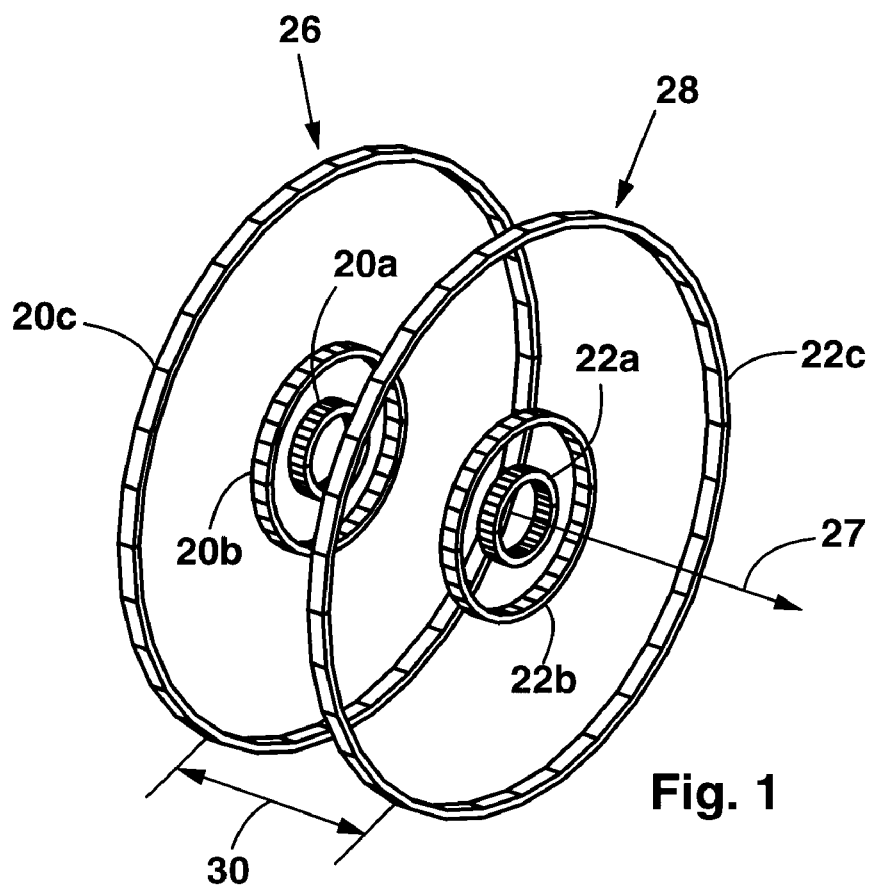
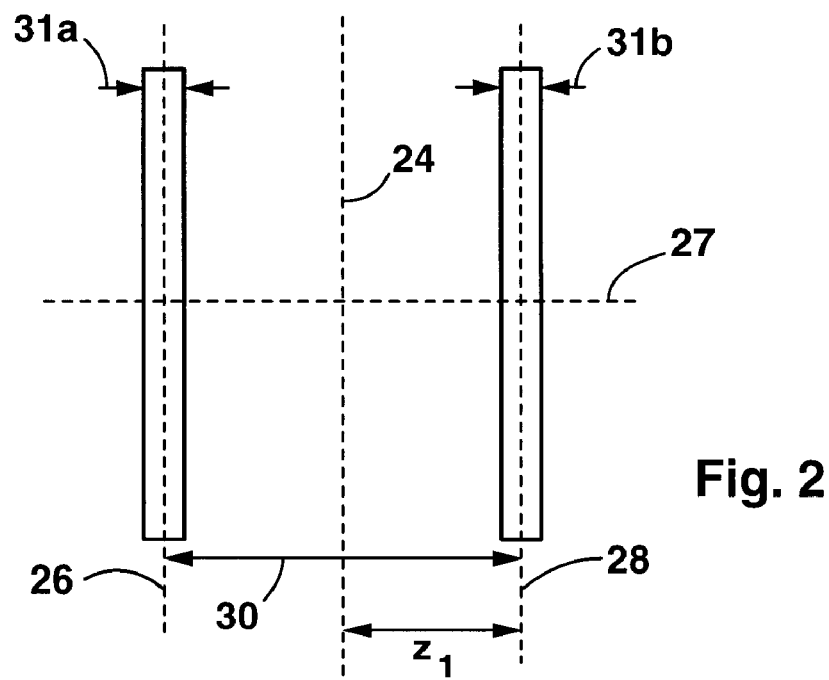

BIPLANAR HOMOGENEOUS FIELD ELECTROMAGNETS AND METHOD FOR MAKING SAME

RELATED APPLICATIONS

This application is a continuation-in-part of patent application Ser. No. 09/289,528 filed on Apr. 9, 1999, now U.S. Pat. No. 6,208,143, which claims the benefit of Provisional application Ser. No. 60/081,311, filed Apr. 10, 1998, which is incorporated herein by reference.

FIELD OF THE INVENTION

This invention relates generally to electromagnets. More particularly, it relates to methods for designing homogeneous field electromagnets for use in magnetic resonance imaging (MRI) or prepolarized magnetic resonance imaging (PMRI).

BACKGROUND OF THE INVENTION

Magnetic resonance imaging (MRI) is a common and well known technique for imaging the internal structure of objects and for medical diagnosis. Conventional MRI requires that the object to be imaged be placed in a homogeneous (typically to within 40 ppm) and strong (typically in the range of 0.5 to 1.5 Tesla) magnetic field. Generating such magnetic fields is difficult and expensive.

Prepolarized MRI (PMRI) is a recent technique which uses a strong, nonhomogeneous pulsed magnetic field in combination with a weaker, homogeneous magnetic field to perform imaging. The strong, pulsed field is known as the polarizing field and it is produced by a polarizing magnet. The weaker, homogeneous field is known as the readout field and is produced by a readout magnet. PMRI is also referred to as switched-field MRI and is related to field cycling nuclear magnetic resonance (NMR) relaxometry.

In PMRI, the polarizing field is switched on briefly (about 0.01 to 2 seconds) to polarize the nuclear spins inside the object to be imaged. Then, the polarizing field is rapidly reduced at a rate faster than the decay rate of the nuclear spin polarization. The nuclear spin polarization is then analyzed in the readout magnetic field. The polarizing field causes the nuclear spin polarization to be greater than it would be with only the readout field. Reference can be made to U.S. Pat. No. 5,629,624 to Carlson et al., U.S. Pat. No. 4,906,931 to Sepponen, and U.S. Pat. No. 5,057,776 to Macovski concerning PMRI.

A result of the pulsed polarizing magnetic field is that it renders a large PMRI device very difficult to build. The magnetic energy stored in the magnet must be removed and restored with every pulse. This practically limits the amount of energy which can be stored in the pulsed magnet and thus the size of the PMRI device. Therefore, future PMRI devices will likely be small dedicated imagers, dedicated to imaging small body parts such as hands, feet, knees, heads, breasts, neck and the like.

Imaging small body parts places limitations on magnet geometry (both readout and polarizing). Most body parts are not cylindrical and therefore do not efficiently occupy the volume inside a traditional cylindrical magnet assembly. A cylindrical magnet assembly is a collection of coils arranged on the surface of a cylinder. Access to the magnetic field of a cylindrical magnet is limited to the end openings of the cylinder or between the coils. This limited access makes it difficult and uncomfortable to image certain body parts such as knees. It is particularly difficult to provide a magnet for imaging a knee or elbow as it is flexing.

It would be an advance in the art to provide readout magnet designs which allow increased access to the homogeneous magnetic field. Such improved magnet designs would be particularly well suited for use in dedicated PMRI machines.

Lee-Whiting discloses a design for a 4-coil biplanar magnet in "Homogeneous Magnetic Fields", *Atomic Energy Commission of Canada Limited* CRT-673, 1–29 (1957). The magnet has 2 coils symmetrically and coaxially disposed in each of two parallel planes. The homogeneous magnetic field is located between the planes defined by the coils. The homogeneous magnetic field can be accessed from the radial direction (i.e., from between the planes defined by the coils). A similar 4-coil design is also disclosed by Garrett in "Thick Cylindrical Coil Systems with Field or Gradient Homogeneities of the 6th to 20th Order", *Journal of Applied Physics*, 38, 2563–2586 (1967). A shortcoming of these 4-coil designs is that they are relatively inefficient in producing the desired homogeneous field, and produce relatively inhomogeneous magnetic fields.

U.S. Pat. No. 4,829,252 to Kaufman discloses an MRI system with improved patient access to the magnetic field. The system of Kaufmann uses biplanar magnets to produce the required homogeneous magnetic field. Kaufman does not disclose how to design the biplanar magnets or specific biplanar magnet designs.

OBJECTS AND ADVANTAGES OF THE INVENTION

Accordingly, it is a primary object of the present invention to provide a method for designing magnets that:

1) produces biplanar magnet designs with improved magnetic field access compared to prior art designs;
2) produces biplanar magnet designs with exceptional magnetic field homogeneity;
3) can be used to design biplanar magnets with relatively large number of coils;
4) can be used to design magnets having a variety of desired properties such as increased efficiency, certain size constraints, certain inductance values or reduced power consumption.

It is a further object of the present invention to provide biplanar magnets that:

1) produce exceptionally homogeneous magnetic fields;
2) are relatively efficient;
3) have improved access o the homogeneous magnetic field.

It is also an object of the present invention to provide an apparatus for prepolarized magnetic resonance imaging (PMRI) that:

1) has improved access to the imaging region;
2) can be adapted to image many different body parts.

These and other objects and advantages will be apparent upon reading the following description and accompanying drawings.

SUMMARY OF THE INVENTION

These objects and advantages are attained by a 6-coil biplanar symmetrical electromagnet. The 6-coil magnet has 3 coils symmetrically and coaxially disposed in each of two parallel planes. The coils have radii and are designed to carry accurately determined currents (in units of Ampere-turns). The 6-coil magnet provides an accurately homogeneous magnetic field between the two planes. The coils enclose an ideal filamentary current loop calculated according to a method of the present invention. The magnet may further include electronics for providing the accurately controlled currents for the coils. The present invention also includes 8-coil and 10-coil biplanar symmetrical electromagnets.

The magnet may also include a polarizing magnet for providing a polarizing magnetic field needed for performing prepolarized magnetic resonance imaging (PMRI). The polarizing magnet can be oriented in many different ways.

The present invention also includes a method for making biplanar symmetrical electromagnets having K coils. The method begins with producing equations for the spherical harmonic coefficients describing the magnetic fields produced by the K coils. The equations for the spherical harmonic coefficients are set equal to zero, which then allows a numerical optimization program to solve the equations for the coil radii, coil locations, and coil currents in units of Ampere-turns. The number of coils K can be equal to or greater than 6.

The present invention also includes magnets made according to the method of the present invention.

Also, the present invention includes an apparatus for performing prepolarized magnetic resonance imaging, (PMRI). The apparatus has a biplanar, symmetrical readout electromagnet made according to the present invention and a polarizing magnet. The readout electromagnet provides a homogeneous magnetic field. The polarizing magnet can have many different orientations with respect to the readout electromagnet.

The present invention includes an alternative method for making electromagnets that uses a reduced number (i.e., less than K−1) of spherical harmonic constraints. Preferably, other nonspherical-harmonic constraints are used in combination with the spherical harmonic constraints. The nonspherical-harmonic constraints can be based on magnetic field efficiency, magnet size, magnet aspect ratio, power consumption or coil conductor volume. The alternative method produces slightly altered magnet designs with somewhat reduced field homogeneity, but with enhancement of other characteristics.

DESCRIPTION OF THE FIGURES

FIG. 1 shows a 6-coil biplanar, symmetrical electromagnet according to the present invention.

FIG. 2 shows an edge-on view of the electromagnet of FIG. 1.

DETAILED DESCRIPTION

Figure 3A:
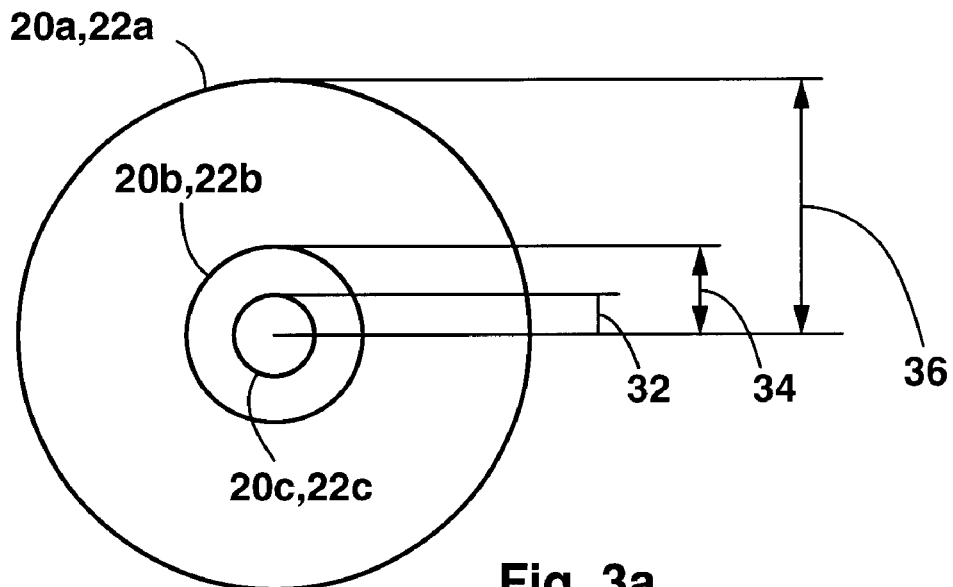
FIG. 3a shows a side view of the electromagnet of FIG. 1.

The present invention provides a method for designing electromagnets with an exceptionally homogeneous magnetic field and improved access to the homogeneous magnetic field. All magnets designed according to the present invention are symmetrical and biplanar.

FIG. 1 shows a 6-coil magnet designed according to a method of the present invention. The magnet is biplanar, and has a small coil 20a, a medium coil 20b, and a large coil 20c located in a first plane 26; and has identical coils 22a, 22b, 22c located in a second plane 28. First plane 26 and second plane 28 are parallel and spaced apart by a distance $2z_1$ 30. All the coils are coaxial about axis 27.

FIG. 2 shows an edge-on view of the magnet of FIG. 1. The distance $2z_1$ 30 between planes 26, 28 is clearly shown. The magnet is symmetrical across symmetry plane 24. Coils have widths 31a, 31b which are preferably centered on the first plane 26 and second plane 28, respectively.

FIG. 3a shows a side view of the magnet of FIG. 1. The coils 20a–c, 22a–c have accurately selected radii 32, 34, 36. The radii of the coils is expressed as a function of the distance $2z_1$ 30. The radii are defined as the distance from the axis 27 to the center of each coil. The following table presents the radii of the coils as a function of the distance $z_1$.

TABLE 1

| Coil | Radius |
| --- | --- |
| Small Coils 20a, 22a | $0.394771z_1$ |
| Medium Coils 20b, 22b | $0.858722z_1$ |
| Large Coils 20c, 22c | $2.491120z_1$ |

In operation, the coils carry accurately controlled currents. The currents carried by the coils are given in the table below.

TABLE 2

| Coil | Ampere-Turns (normalized) |
| --- | --- |
| Small Coils 20a, 22a | $1I_s$ |
| Medium Coils 20b, 22b | $3.596420I_s$ |
| Large Coils 20c, 22c | $118.3143I_s$ |

Increasing or decreasing the currents in the coils while maintaining the normalized current values will only change the magnetic field magnitude. The magnetic field homogeneity and distribution will be preserved. The Ampere-turns value $I_s$ is arbitrary.

Figure 3B:
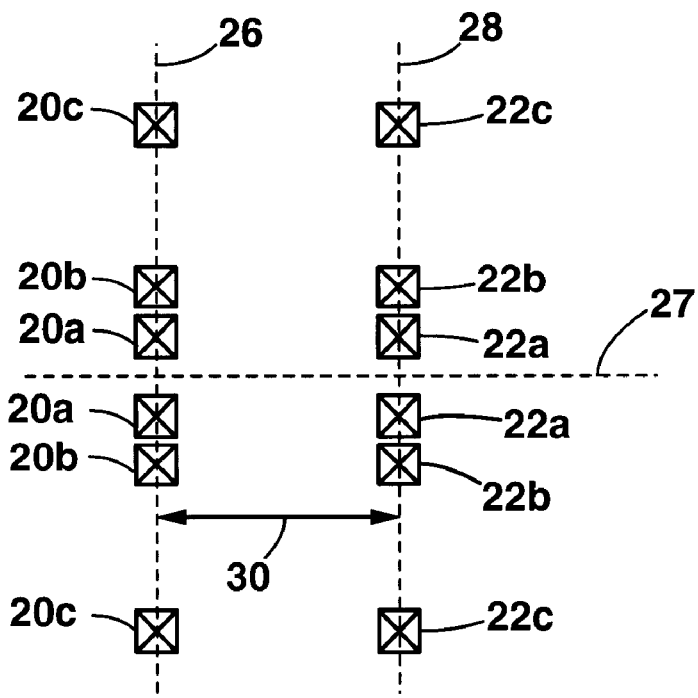
FIG. 3b shows a cross sectional view of the magnet of FIG. 1.

FIG. 3b shows a cross sectional view of the magnet of FIG. 1. The radii values given in Table 1 correspond approximately to the distance from the axis 27 to the centers of the coils 20a–c and 22a–c. However, it is understood that this is not a necessary feature of the present invention.

Figure 4:
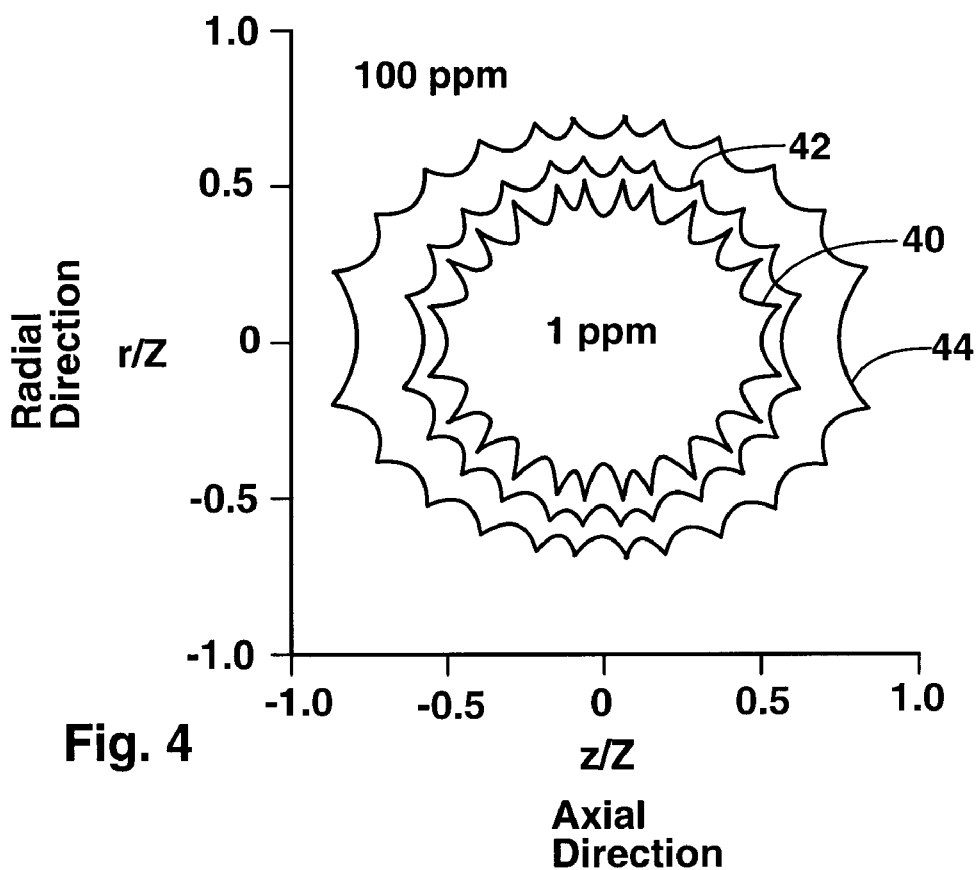
FIG. 4 shows a plot of field homogeneity contours of the magnet of FIG. 1.

The magnet of FIG. 1 having the given coil radii and carrying the given currents provides an accurately homogeneous axial magnetic field in the center of the magnet between the planes 26, 28. FIG. 4 shows a plot of the magnetic field distribution in a plane perpendicular to planes 26, 28 and coincident with the magnet axis 27. $2z_1$ is the distance 30 between first plane 26 and second plane 28. Region 40 illustrates approximately the volume where the magnetic field is homogeneous to within 1 part-per-million. The magnetic field homogeneity is worse than 10 parts-per-million outside region 42, and the magnetic field homogeneity is worse than 100 parts-per-million outside region 44.

It is noted that the homogeneity of the magnetic field within region 40 is sensitively dependent upon the positioning of the coils 20a–c, 22a–c and the normalized magnitudes of the coil currents. Small displacements of the coils causes relatively large changes in the magnetic field homogeneity; small changes in the coil currents also cause relatively large changes in the magnetic field homogeneity. Therefore, it is important for the magnet of the present invention to have coil positions and normalized coil currents that are accurately equal to the values given in Tables 1 and 2. However, small changes from the given values are within the scope of the present invention. Generally, the coil radii and normalized coil currents must be within 1% of the values given in Tables 1 and 2.

It is understood that radii and normalized current values close to the values given in Tables 1 and 2 will provide the most homogeneous magnetic fields.

Design Method

The present invention includes several methods for designing biplanar, symmetrical electromagnets. The magnet of FIGS. 1–3 is a specific example of a biplanar symmetrical magnet having 6 coils and designed according to a preferred method of the present invention. The methods of the present invention can be used to design biplanar, symmetrical electromagnets with any even number of coils. For example, the present methods can be used to design biplanar symmetrical electromagnets with 8, 10, 12, 14, 16 or more coils.

Figure 5:
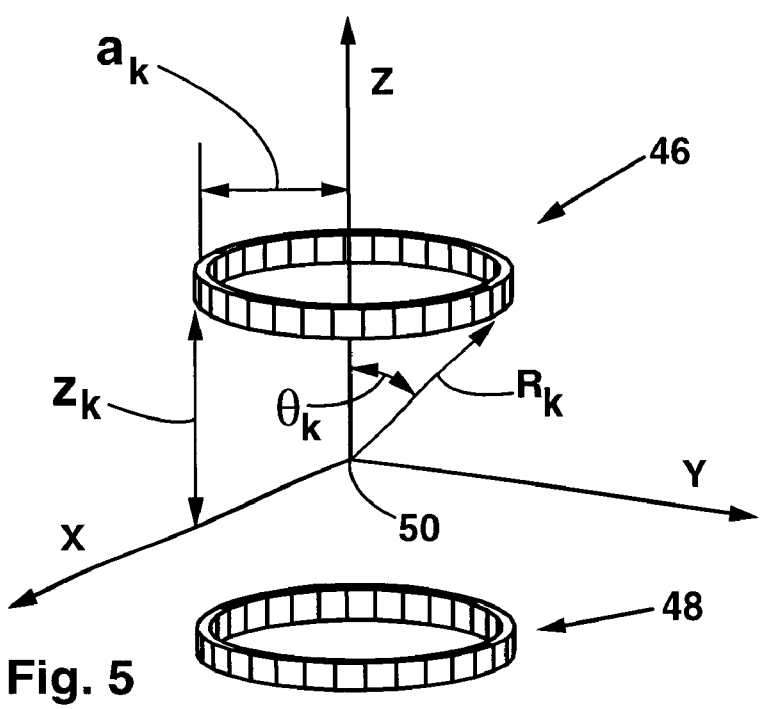
FIG. 5 illustrates variables for describing coils in the electromagnets of the present invention.

FIG. 5 shows a geometry used to describe the current loops. Shown are two identical loops 46, 48 symmetrically disposed about an origin 50.

Generally, the position of the $k^{th}$ loop is denoted by the spherical coordinates ($R_k$, $\theta_k$) and the current carried by the $k^{th}$ loop is denoted by $I_k$ (in units of Ampere-turns). The radius of the $k^{th}$ loop is denoted by $a_k$, and the Z-position of the $k^{th}$ loop is given by $Z_k$. The radius $a_k$ and Z-position $Z_k$ are related to the spherical coordinates by the transformation:

$$a_k = R_k \sin \theta_k$$
$$Z_k = R_k \cos \theta_k$$

Using this geometry, the radial magnetic field component $B_r$ and axial magnetic field component $B_z$ at a point ($R, \theta$) can be written as:

$$B_r(R, \theta) = \frac{\mu}{2} \sum_{n=1}^{\infty} \frac{C_n}{n+1} R^n P_n^1(\cos\theta)$$

$$B_z(R, \theta) = \frac{\mu}{2} \sum_{n=0}^{\infty} C_n R^n P_n(\cos\theta).$$

Where $P_n$ are associated Legendre polynomials of the first kind and degree (n) and order 1, and $\mu$ is the permeability of free space. The values $C_n$ are spherical harmonic coefficients and are given by:

$$C_n = -\sum_k I_k R_k^{-(n+1)} \sin\theta_k P_{n+1}^1(\cos\theta_k). \qquad \text{EQ 1}$$

Where $P_{n+1}^1$ are associated Legendre polynomials of the first kind and degree (n+1) and order 1. The coefficient for n=0 corresponds to the spatially invariant (DC) magnetic field component. Due to the magnet symmetry, the odd-index spherical harmonic coefficients are always zero (e.g., $C_1 = C_3 = C_5 \ldots = 0$).

Given that the magnet design is biplanar and symmetrical (necessary constraints in the present invention), the number of free design variables are limited to the following:

Currents: (K/2−1) degrees of freedom. Since only current ratios affect the field homogeneity, one of the coil currents is arbitrarily set to one.

Radii: (K/2−1) degrees of freedom. Since only coil radius ratios affect field homogeneity, one of the coil radii is arbitrarily set to one.

Spacing between planes: One degree of freedom. The spacing can be expressed in terms of the arbitrarily set radius, or vice versa.

Therefore, there exist (K/2−1)+(K/2−1)+1=K−1 different free design variables for a biplanar, symmetrical magnet with K coils.

In the present preferred method, the coil radii $a_k$, coil currents $I_k$, and spacing between planes $2z_1$ (i.e., spacing between planes 26 and 28) are chosen so that the first K−1 even-degree spherical harmonic coefficients are zero, or close to zero. Therefore, the lowest-degree non-zero spherical harmonic coefficient has degree M=2K. The integer M is called the order of the magnetic field. The first M−1 spherical harmonic coefficients are zero (i.e., $C_1 = C_2 = C_3 = \ldots = C_{M-1} = 0$, and $C_M \neq 0$). Since both radial and axial components of the field vary as $R^M$, the magnetic field becomes more homogeneous in the vicinity of the origin as the field order M increases. In the preferred method, the integer M is equal to twice the number of coils in the magnet (e.g., M=12 for a 6-coil magnet).

The appropriate coil radii $a_k$, coil currents $I_k$, and spacing $2z_1$ are determined by setting the coefficients $C_n$ approximately equal to zero for all even values of n less than M. The resultant set of equations is then solved for $a_k$ and $2z_1$ (both of which are expressed in terms of the spherical coordinates $\theta_K$ and $R_k$), and currents $I_k$. Since the equations are nonlinear, they can be solved numerically on a computer having software such as MATLAB. Of course, when using numerical computer methods, the spherical harmonic coefficients cannot be set identically to zero. The spherical harmonic coefficients must be constrained by a maximum acceptable limit.

As a specific example, for a magnet with 6 coils, the following equations are produced:

$$\epsilon_1 \leq \left| \sum_{k=1}^{6} I_k R_k^{-(2+1)} \sin\theta_k P_{2+1}^1(\cos\theta_k) \right|$$

$$\epsilon_2 \leq \left| \sum_{k=1}^{6} I_k R_k^{-(4+1)} \sin\theta_k P_{4+1}^1(\cos\theta_k) \right|$$

$$\epsilon_3 \leq \left| \sum_{k=1}^{6} I_k R_k^{-(6+1)} \sin\theta_k P_{6+1}^1(\cos\theta_k) \right|$$

$$\epsilon_4 \leq \left| \sum_{k=1}^{6} I_k R_k^{-(8+1)} \sin\theta_k P_{8+1}^1(\cos\theta_k) \right|$$

$$\epsilon_5 \leq \left| \sum_{k=1}^{6} I_k R_k^{-(10+1)} \sin\theta_k P_{10+1}^1(\cos\theta_k) \right|$$

Where $\epsilon 1$, $\epsilon 2$, $\epsilon 3$, $\epsilon 4$, and $\epsilon 5$ are maximum acceptable limits on the spherical harmonic coefficients. Computerized numerical optimization techniques often cannot provides solutions for $\epsilon 1 = \epsilon 2 = \epsilon 3 = \epsilon 4 = \epsilon 5 = 0$. The epsilon values should have a small but nonzero value within the numerical roundoff capabilities of the computer system used for the calculations. Numerical roundoff considerations are well known in the art of numerical optimization and computing.

When solved numerically for $I_k$, $R_k$, and $\theta_k$, this set of coupled nonlinear equations provides the current and radius values given in Tables 1 and 2 (where the radius values are expressed in terms of the spacing $z_1$). The 6-coil magnet provided by this design method has a magnetic field order of 12.

The present invention can be applied to cases where the number of coils K is any even number. For example, the present invention can be used to design biplanar, symmetrical magnets with 8, 10, 12, 14, or more coils.

Electromagnets made according to the present invention are particularly well suited for use as a readout magnet in prepolarized magnetic resonance imaging (PMRI). PMRI requires a polarizing magnet in addition to a readout magnet. The magnets of the present invention offer several possibilities for conveniently locating the polarizing magnet.

Figure 6:
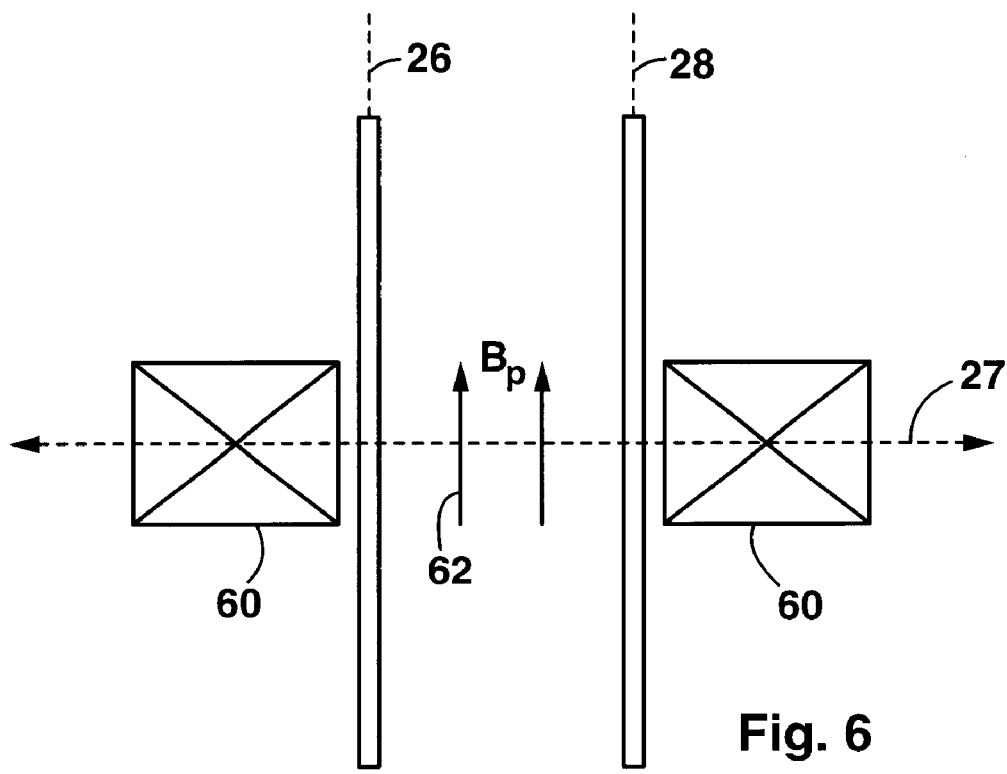
FIGS. 6–9 show different ways in which the biplanar, symmetrical magnets can be used in a prepolarized magnetic resonance imaging (PMRI) device.

FIG. 6 shows an example of a combination of a polarizing magnet and biplanar readout magnet according to the present invention. FIG. 6 is an edge-on view of the first plane 26 and second plane 28. A solenoidal polarizing magnet 60 provides a polarizing magnetic field 62 which is perpendicular to axis 27. Of course, a readout magnetic field provided by the biplanar coils in planes 26, 28 is parallel with the axis 27. It is noted that the polarizing magnet 60 and coils of the biplanar magnet must be sized so that they do not intersect.

Figure 7:
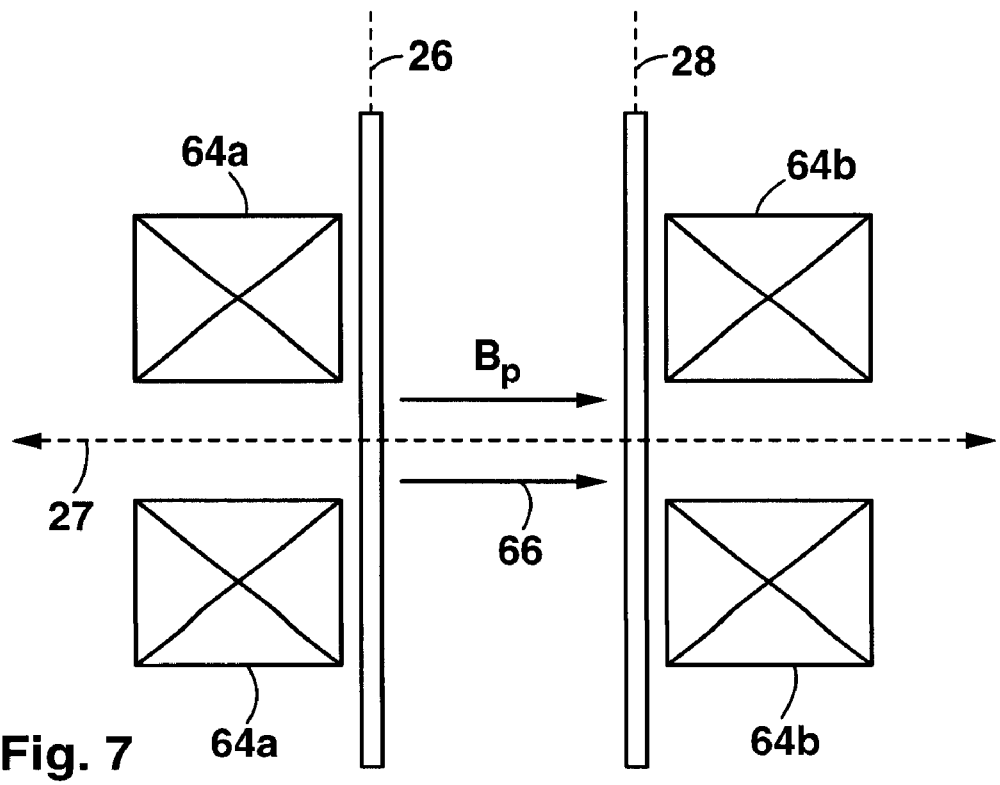

FIG. 7 shows another example of a polarizing magnet combined with a biplanar readout magnet for use in PMRI. Two solenoidal polarizing magnets 64a, 64b provide a polarizing magnetic field 66 parallel with axis 27. The polarizing magnets are coaxial with coils of the biplanar readout magnet (i.e., coaxial about axis 27).

Figure 8:
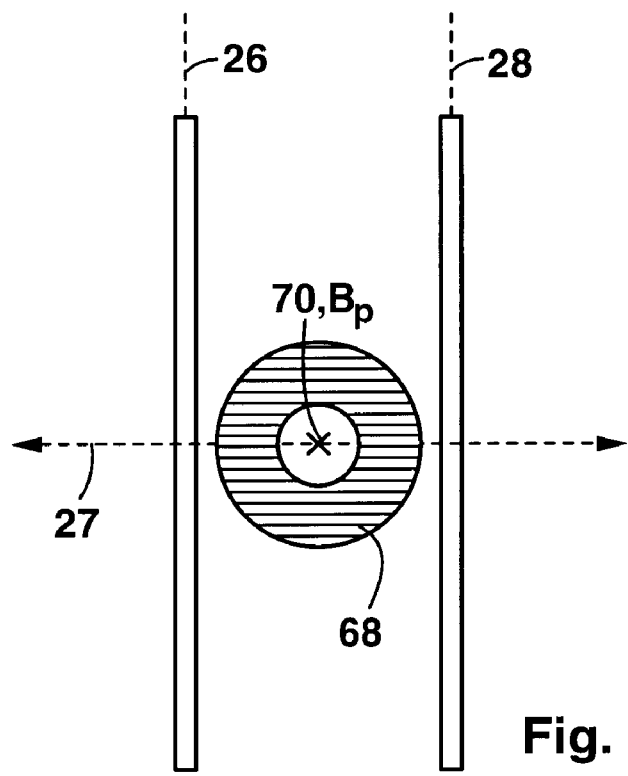

FIG. 8 shows another example where a solenoidal polarizing magnet 68 is disposed between planes 26, 28. The polarizing magnet 68 provides a polarizing field 70 perpendicular to the page.

Figure 9:
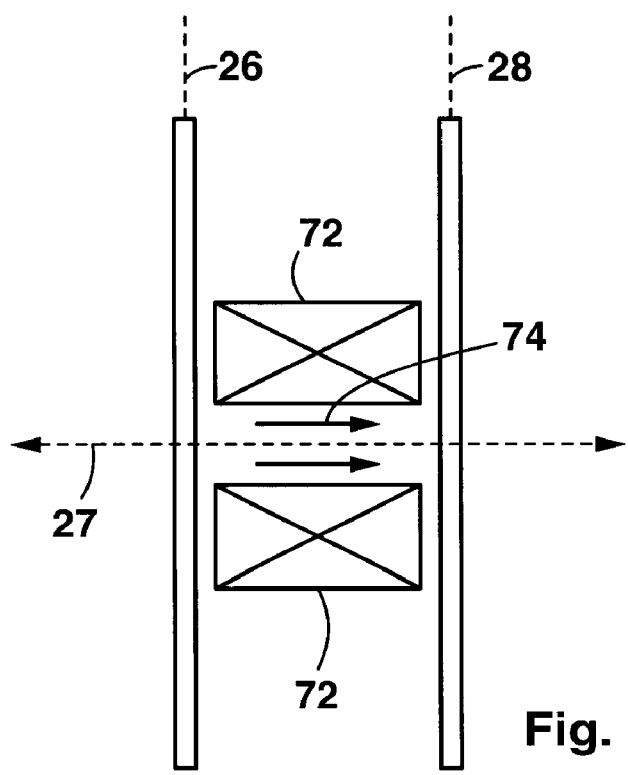

FIG. 9 shows another example where a solenoidal polarizing magnet 72 is disposed between planes 26, 28 and coaxial with the biplanar magnet axis 27. The polarizing magnet provides polarizing magnetic field 74 for PMRI. In this embodiment, access to the homogeneous field is provided along the axis 27, through plane 26 or through plane 28.

PMRI systems according to FIGS. 6–9 provide relatively open access to the region having both the homogeneous field and polarizing field, where imaging is provided.

Figure 10:
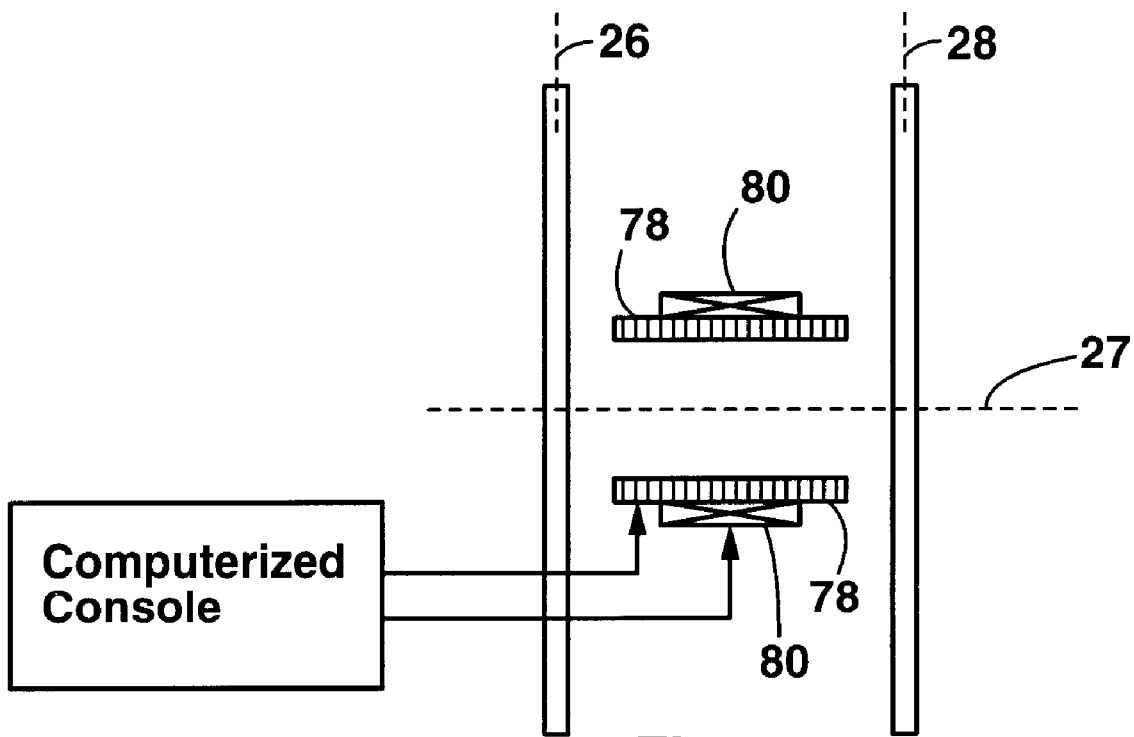
FIG. 10 shows a conventional magnetic resonance imaging device according to the present invention.

Magnets according to the present invention can also be used in conventional magnetic resonance imaging (MRI) devices. FIG. 10 shows a conventional MRI device using a magnet according to the present invention. The device has a biplanar symmetrical magnet with coils disposed in first plane 26 and second plane 28. The biplanar symmetrical magnet provides a homogeneous magnetic field necessary for MRI. The device also has gradient coils 78, radiofrequency (RF) coils 80 for exciting nuclear spins, and a computerized console 82 for controlling the gradient coils 78 and RF coils 80.

The present invention includes designs for 8 coil and 10 coil biplanar, symmetrical electromagnets. Given below are design parameters for these magnets. All the radius values are expressed in terms of z (one-half the spacing between coil planes), and all the Ampere-turn values are normalized so that the current in the smallest coil is 1.

8-Coil Biplanar Design Parameters

| Coil | Radius | Ampere-Turns (normalized) |
|---|---|---|
| Small | 0.294922z | $1I_s$ |
| Medium | 0.590474z | $2.581089I_s$ |
| Large | 1.031283z | $7.938104I_s$ |
| Extra large | 2.632601 | $233.1785I_s$ |

There is a small coil, a medium coil, a large coil and an extra large coil in each plane. All the coils are coaxial.

10-Coil Biplanar Design Parameters

| Coil | Radius | Ampere-Turns (normalized) |
|---|---|---|
| Extra Small | 0.236199z | $1I_s$ |
| Small | 0.457269z | $2.255341I_s$ |
| Medium | 0.734885z | $4.938906I_s$ |
| Large | 1.164685z | $14.159399I_s$ |
| Extra Large | 2.745650z | $386.32597I_s$ |

There is an extra small coil, a small coil, a medium coil, a large coil and an extra large coil in each plane. All the coils are coaxial.

Magnets according to the present invention are characterized in that the coil radii, the coil currents, and the spacing between planes are provided by numerical optimization of nonlinear equations describing spherical harmonic coefficients. An electromagnet according to the present invention will have radii and currents specified by the above-described numerical optimization procedure. The method generally provides a single global solution to the set of nonlinear equations used in the present invention.

It is understood that the radii given for 6-coil, 8-coil, and 10-coil magnets are for ideal filamentary current loops with infinite current density. When building a magnet according to the present invention, such ideal filamentary current loops must be approximated by real coils having a finite thickness and finite current density. Typically, filamentary loops are approximated by locating the centers of the real coils at the same location as the ideal filamentary loops. Filamentary loops can also be approximated by building real coils to enclose the filamentary loops. Also, shimming techniques can be used to alter slightly the dimensions of the coils or currents used in the coils. Given ideal filamentary loop locations and currents, a technician skilled in the art of magnet design and construction will be able to construct a real magnet providing essentially the same magnetic field as the ideal filamentary loops.

Design Method with Reduced Spherical Harmonic Constraints

In the preferred design method described above, the maximum number of spherical harmonic constraints is K−1, and all K−1 spherical harmonic constraints are applied in the design method. No other constraints are used. This method provides a magnet having a field order of M=2K.

In an alternative design method according to the present invention, fewer than the maximum number (K−1) of spherical harmonic constraints are applied to the magnet design. One or more of the possible K−1 spherical harmonic constraints are disregarded in the design method. In this alternative embodiment, the magnet will have a field order of less than M=2K. Preferably, other constraints (i.e. constraints not based on the spherical harmonics) are included in the design calculations.

As a specific example, consider a 6-coil symmetrical biplanar magnet designed with only the following constraints:

$$\varepsilon_1 \leq \left| \sum_{k=1}^{6} I_k R_k^{-(2+1)} \sin\theta_k P_{2+1}^1(\cos\theta_k) \right|$$

$$\varepsilon_2 \leq \left| \sum_{k=1}^{6} I_k R_k^{-(4+1)} \sin\theta_k P_{4+1}^1(\cos\theta_k) \right|$$

$$\varepsilon_3 \leq \left| \sum_{k=1}^{6} I_k R_k^{-(6+1)} \sin\theta_k P_{6+1}^1(\cos\theta_k) \right|$$

$$\varepsilon_4 \leq \left| \sum_{k=1}^{6} I_k R_k^{-(8+1)} \sin\theta_k P_{8+1}^1(\cos\theta_k) \right|$$

The constraint on the 10$^{th}$ order spherical harmonic has been dropped, so a 6 coil magnet designed according to these constraints will have field order M=10 instead of 2K=M=12. The 6-coil magnet designed with field order M=10 according to only the above four spherical harmonic constraints has the following design parameters:

6-coil, M = 10 Design Parameters

| Coil | Radius | Ampere-Turns (normalized) |
| --- | --- | --- |
| Small | 0.719325z1 | 1$I_s$ |
| Medium | 1.189337z1 | -2.893504$I_s$ |
| Large | 1.950000z1 | 21.051452$I_s$ |

The negative current in the medium coil indicates a reverse current flow. A magnet with these design parameters is more energy efficient and smaller than the 6-coil, M=12 magnet designed with 5 spherical harmonic constraints. Of course, the M=10 magnet provides a somewhat less homogeneous magnetic field due to its lower field order. Higher energy efficiency and smaller size come at a cost of lower magnetic field homogeneity. For some applications, this is desirable.

In the present reduced spherical harmonic constraint method it is preferred to eliminate only the highest-order spherical harmonic constraints. Only the spherical harmonic constraints with the lowest possible values for n should be used. For example, in the above 6-coil, M=10 magnet design method, the constraint on the 10$^{th}$ order spherical harmonic was not used. If, for example, the constraint on the 4$^{th}$ order spherical harmonic coefficient was instead eliminated then the magnet would provide a much less homogeneous magnetic field. If two spherical harmonic constraints are dropped, they should be the highest-order constraints (e.g. the 8$^{th}$ order and 10$^{th}$ order constraints in the case of a 6-coil magnet).

The present reduced field order constraint method is also applicable to magnets having 8, 10, 12, 14 or more coils. For example, a 10-coil, field order M=16 magnet can be designed using the following 7 spherical harmonic constraints:

$$\varepsilon_1 \leq \left| \sum_{k=1}^{10} I_k R_k^{-(2+1)} \sin\theta_k P_{2+1}^1(\cos\theta_k) \right|$$

$$\varepsilon_2 \leq \left| \sum_{k=1}^{10} I_k R_k^{-(4+1)} \sin\theta_k P_{4+1}^1(\cos\theta_k) \right|$$

$$\varepsilon_3 \leq \left| \sum_{k=1}^{10} I_k R_k^{-(6+1)} \sin\theta_k P_{6+1}^1(\cos\theta_k) \right|$$

$$\varepsilon_4 \leq \left| \sum_{k=1}^{10} I_k R_k^{-(8+1)} \sin\theta_k P_{8+1}^1(\cos\theta_k) \right|$$

$$\varepsilon_5 \leq \left| \sum_{k=1}^{10} I_k R_k^{-(10+1)} \sin\theta_k P_{10+1}^1(\cos\theta_k) \right|$$

$$\varepsilon_6 \leq \left| \sum_{k=1}^{10} I_k R_k^{-(12+1)} \sin\theta_k P_{12+1}^1(\cos\theta_k) \right|$$

$$\varepsilon_7 \leq \left| \sum_{k=1}^{10} I_k R_k^{-(14+1)} \sin\theta_k P_{14+1}^1(\cos\theta_k) \right|$$

In a preferred embodiment of the present invention, other constraints not related to the spherical harmonics are used in combination with spherical harmonic constraints. In this embodiment, the number of spherical harmonic constraints used should be less than K−1. This is because K−1 spherical harmonic constraints generally provides a unique magnet design. Additional constraints provide no further design optimization. There is no definable upper limit on the total number of constraints that can be used.

The number and type of constraints should be selected such that a unique design is provided. If there are too few constraints, or if the constraints are too permissive, a large number of magnet designs will be provided. If there are too many constraints, or if the constraints are too selective, no design will satisfy all the constraints.

The constraints used in the present method can specify that a mathematical quantity is less than or greater than a certain numerical limit. Alternatively, the constraint can specify that a mathematical quantity is minimized or maximized. In this embodiment each quantity is separately minimized. In this way, a unique solution can be found even if a portion or all of the constraints are minimization or maximization constraints.

As a specific example, a constraint based on magnetic field efficiency can be used in combination with the spherical harmonic constraints. Magnetic field efficiency in superconducting magnets and resistive magnets is given by:

$$\text{Efficiency} \propto \frac{B_0}{\sum_k I_k} \text{ for superconducting magnets}$$

$$\text{Efficiency} \propto \frac{B_0^2}{\frac{2\pi}{\sigma} \sum_k \frac{I_k^2 a_k}{A_k}} \text{ for resistive magnets}$$

Where $B_o$ is the magnetic field in the center of the magnet, $\sigma$ is the resistivity of the coil material, and $A_k$ is the cross sectional conductor area of the k$^{th}$ coil.

Constraints based on magnetic field efficiency for superconducting and resistive magnet designs can be written as follows:

$$\varepsilon \leq \frac{B_0}{\sum_k I_k}$$

$$\varepsilon \leq \frac{B_0^2}{\frac{2\pi}{\sigma}\sum_k \frac{I_k^2 a_k}{A_k}}$$

where $\epsilon$ is a minimum acceptable magnetic field efficiency for the magnet.

As an illustrative example, the above superconductive magnetic field efficiency constraint is combined with the first 4 spherical harmonic constraints for a 6-coil magnet design:

$$\varepsilon_1 \leq \left|\sum_{k=1}^{6} I_k R_k^{-(2+1)} \sin\theta_k P_{2+1}^1(\cos\theta_k)\right|$$

$$\varepsilon_2 \leq \left|\sum_{k=1}^{6} I_k R_k^{-(4+1)} \sin\theta_k P_{4+1}^1(\cos\theta_k)\right|$$

$$\varepsilon_3 \leq \left|\sum_{k=1}^{6} I_k R_k^{-(6+1)} \sin\theta_k P_{6+1}^1(\cos\theta_k)\right|$$

$$\varepsilon_4 \leq \left|\sum_{k=1}^{6} I_k R_k^{-(8+1)} \sin\theta_k P_{8+1}^1(\cos\theta_k)\right|$$

Minimize the quantity $\frac{B_0}{\sum_k I_k}$

The magnetic field efficiency constraint is included as a minimization constraint, rather than as a constraint having a numerical limit. In this way, the design method will tend to select a single magnet design.

Alternatively, the magnetic field efficiency constraint can be included as a constraint having a numerical limit $\epsilon_5$:

$$\varepsilon_1 \leq \left|\sum_{k=1}^{6} I_k R_k^{-(2+1)} \sin\theta_k P_{2+1}^1(\cos\theta_k)\right|$$

$$\varepsilon_2 \leq \left|\sum_{k=1}^{6} I_k R_k^{-(4+1)} \sin\theta_k P_{4+1}^1(\cos\theta_k)\right|$$

$$\varepsilon_3 \leq \left|\sum_{k=1}^{6} I_k R_k^{-(6+1)} \sin\theta_k P_{6+1}^1(\cos\theta_k)\right|$$

$$\varepsilon_4 \leq \left|\sum_{k=1}^{6} I_k R_k^{-(8+1)} \sin\theta_k P_{8+1}^1(\cos\theta_k)\right|$$

$$\varepsilon_5 \geq \frac{B_0}{\sum_k I_k}$$

In this embodiment, there is no guarantee that a solution exists to satisfy all the constraints. The existence of a solution depends upon the values of $\epsilon_1$, $\epsilon_2$, $\epsilon_3$, $\epsilon_4$, and $\epsilon_5$. If the values for $\epsilon_1$–$\epsilon_5$ are too large, a solution may not exist. If the values for $\epsilon_1$–$\epsilon_5$ are too small, many solutions may exist.

Also, a magnet efficiency constraint can be based on the Fabry factor G, which is a complicated function of magnet geometry. For more information on the Fabry factor, reference can be made to Solenoid Magnet Design, by D. B. Montgomery, R. E. Krieger Publishing Co, Malabar, Fla., 1980.

Similarly, constraints can be placed upon the aspect ratio of the magnet. For example, a maximum aspect ratio can be imposed on the coils using the constraint:

$$\varepsilon \geq \frac{a_k}{z_1},$$

where $\epsilon$ is a maximum acceptable aspect ration for the largest coil. An aspect ratio constraint can also be posed as a minimization or maximization constraint.

Also, a minimum aspect ratio can be imposed on the coils using the constraint:

$$\varepsilon \leq \frac{a_k}{z_1},$$

where $\epsilon$ is a minimum acceptable aspect ratio for the smallest coil.

Also, constraints can be placed upon the physical dimensions of the magnet coils. For example a maximum radius limit can be imposed using the constraint:

$$R_{max} \geq a_k$$

where $R_{max}$ is a maximum allowable coil radius.

Similarly, a minimum radius limit can be imposed using the constraint:

$$R_{min} \leq a_k$$

where $R_{min}$ is a minimum allowable coil radius. A minimum coil radius limitation can be useful in designing magnets for MRI where access to the field is provided axially.

Also, constraints can be placed on the inductance of the magnet. Constraints can be designed to specify low, high, or moderate inductance values. Inductance is generally a complicated function of magnet geometry, so a generalized inductance constraint cannot be written here. For more information on how to mathematically express constraints on magnet inductance reference can be made to *Inductance Calculations*, by F. Grover, Dover Publications, New York, N.Y., 1973.

Also, constraints can be placed upon the volume of conductor material used in the magnet. Conductor volume constraints can be based on the following equation:

$$\text{Volume} = 2\pi \sum_k a_k A_k$$

where $a_k$ is the radius of the $k^{th}$ coil, and $A_k$ is the cross sectional area of the $k^{th}$ coil.

Also, a constraint can be placed on the power consumption of the magnet. In such a constraint, the power consumption is expressed in terms of the currents can coil resistance, which depends upon the coil dimensions and conductor material.

The present invention is equally applicable to making resistive magnets and superconducting magnets. The magnets of the present invention can be either resistive (e.g., copper coils) or superconducting.

It will be clear to one skilled in the art that the above embodiment may be altered in many ways without departing from the scope of the invention. Accordingly, the scope of the invention should be determined by the following claims and their legal equivalents.

What is claimed is:

1. A method for making a biplanar, symmetrical electromagnet having K coils, where K is an even integer, comprising the steps of:

a) defining K−1 spherical harmonic constraints substantially equivalent to $$\varepsilon_n \leq \left| \sum_{k=1}^{K} I_k R_k^{-(n+1)} \sin \theta_k P_{n+1}^1 (\cos \theta_k) \right|$$

wherein each constraint has a different value of n, wherein each value of n is a positive, even integer less than 2K, wherein $\varepsilon_v$ is a maximum limit on an $n^{th}$ order spherical harmonic coefficient, and wherein $I_k$ denotes the Ampere-turns and $R_k$ and $\theta_k$ denote the spherical coordinates of a $k^{th}$ coil;

b) solving the constraints defined in step (a) for values of $I_k$, $R_k$, and $\theta_k$, wherein the coils are constrained to two parallel planes and the coils are symmetrical; and c) building coils corresponding to values of $R_k$ and $\theta_k$ found in step (b) and capable of carrying Ampere-turns proportionate to values of $I_k$ found in step (b).

2. The method of claim 1 wherein K is equal to or greater than 6.

3. A biplanar, symmetrical electromagnet made according to the method of claim 1 and having at least 6 coils.

4. An apparatus for prepolarized magnetic resonance imaging, comprising:

a) a biplanar, symmetrical readout electromagnet for providing a homogeneous magnetic field, wherein the readout magnet has a first plane and a second plane, wherein the readout magnet has at least 6 coils, and wherein the readout magnet is made according to the method of claim 1; and b) a polarizing magnet disposed such that a polarizing magnetic field is provided in the region of the homogeneuos magnetic field.

5. The apparatus of claim 4 wherein the polarizing magnet is a solenoidal magnet disposed between the first plane and the second plane such that the polarizing magnetic field is perpendicular to the homogeneous magnetic field.

6. The apparatus of claim 4 wherein the polarizing magnet is a solenoidal magnet disposed between the first plane and the second plane such that the polarizing magnetic field is parallel to the homogeneous magnetic field.

7. The apparatus of claim 4 wherein the polarizing magnet is a solenoidal magnet disposed outside the first plane and second plane and wherein the polarizing magnet is coaxial with the readout magnet.

8. An apparatus for magnetic resonance imaging, comprising:

a) a biplanar, symmetrical electromagnet made according to the method of claim 1 and having at least 6 coils for providing a homogeneous magnetic field;

b) a gradient coil for providing gradient fields in the region of the homogeneous magnetic field;

c) a radiofrequency coil for exciting nuclear spins in the region of the homogeneous magnetic field;

d) a computerized console for controlling the gradient coil and radiofrequency coil.

9. A method for making a biplanar, symmetrical electromagnet having K coils, where K is an even integer, comprising the steps of:

a) defining at most K−1 spherical harmonic constraints substantially equivalent to $$\varepsilon_n \leq \left| \sum_{k=1}^{K} I_k R_k^{-(n+1)} \sin \theta_k P_{n+1}^1 (\cos \theta_k) \right|$$

wherein:
1) each constraint has a different value of n;
2) each value of n is a positive, even integer less than 2K;
3) the values of n are the lowest values possible given the value of K−1;
4) $\varepsilon_v$ is a maximum limit on an $n^{th}$ order spherical harmonic coefficient; and
5) $I_k$ denotes the Ampere-turns and $R_k$ and $\theta_k$ denote the spherical coordinates of a $k^{th}$ coil;

b) defining a nonspherical-harmonic constraint;

c) solving the constraints defined in steps (a) and (b) for values of $I_k$, $R_k$, and $\theta_k$, wherein the coils are constrained to two parallel planes and the coils are symmetrical; and d) building coils corresponding to values of $R_k$ and $\theta_k$ found in step (c) and capable of carrying Ampere-turns proportionate to values of $I_k$ found in step (c).

10. The method of claim 9 wherein K is equal to or greater than 6.

11. The method of claim 9 wherein K−2 spherical harmonic coefficients are defined in step (a).

12. The method of claim 9 wherein K−3 spherical harmonic coefficients are defined in step (a).

13. The method of claim 9 wherein K−4 spherical harmonic coefficients are defined in step (a).

14. The method of step 9 wherein the nonspherical-harmonic constraint of step (b) is directed toward a magnet characteristic selected from the group consisting of magnetic field efficiency, magnet size, magnet coil aspect ratio, inductance, conductor volume, and power consumption.

15. The method of claim 9 wherein the magnet is a superconducting magnet and the nonspherical-harmonic constraint relates to magnet efficiency and is substantially equivalent to the expression:

$$\varepsilon \leq \frac{B_o}{\sum_k I_k}$$

where $B_o$ is a magnetic field intensity in the center of the magnet, $I_k$ is the current in a $k^{th}$ coil and where $\varepsilon$ is a minimum acceptable efficiency for the magnet.

16. The method of claim 9 wherein the magnet is a resistive magnet and the nonspherical-harmonic constraint relates to magnet efficiency and is substantially equivalent to the expression:

$$\varepsilon \leq \frac{B_0^2}{\frac{2\pi}{\sigma} \sum_k \frac{I_k^2 a_k}{A_k}}$$

where $B_o$ is a magnetic field intensity in the center of the magnet, $I_k$ is the current in a $k^{th}$ coil, $a_k$ is a radius of the $k^{th}$ coil, and $A_k$ is a cross sectional conductor area of the $k^{th}$ coil, $\sigma$ is a resistivity of a coil conductor material, and where $\varepsilon$ is a minimum acceptable magnetic field efficiency for the magnet.

17. The method of claim 9, wherein the nonspherical-harmonic constraint relates to aspect ratio and is substantially equivalent to the expression:

$$\varepsilon \geq \frac{a_k}{z_1}$$

for all k where $\varepsilon$ is a maximum allowable aspect ration for all the coils, $a_k$ is a radius of the $k^{th}$ coil, and $z_1$ is ½ the distance between magnet planes.

18. The method of claim 9 wherein the nonspherical-harmonic constraint relates to aspect ratio and is substantially equivalent to the expression:

$$\varepsilon \leq \frac{a_k}{z_1}$$

for all k where $\varepsilon$ is a minimum allowable aspect ratio for all the coils, $a_k$ is a radius of the $k^{th}$ coil, and $z_1$ is ½ the distance between magnet planes.

19. The method of claim 9 wherein the nonspherical-harmonic constraint relates to coil physical dimensions and is substantially equivalent to the expression:

$$R_{max} \geq a_k \text{ for all } k$$

where $R_{max}$ is a maximum allowable coil radius, and $a_k$ is a radius of the $k^{th}$ coil.

20. The method of claim 9 wherein the nonspherical-harmonic constraint relates to coil physical dimensions and is substantially equivalent to the expression:

$$R_{min} \leq a_k \text{ for all } k$$

where $R_{min}$ is a minimum allowable coil radius, and $a_k$ is a radius of the $k^{th}$ coil.

21. The method of claim 9 wherein the nonspherical-harmonic constraint relates to conductor volume and is substantially equivalent to the expression:

$$\varepsilon \geq 2\pi \sum_k a_k A_k$$

where $a_k$ is a radius of the $k^{th}$ coil, $A_k$ is a cross sectional area of the $k^{th}$ coil, and $\varepsilon$ is a maximum acceptable conductor volume.

22. A biplanar, symmetrical electromagnet made according to the method of claim 9 and having at least 6 coils.

23. An apparatus for prepolarized magnetic resonance imaging, comprising:
   a) a biplanar, symmetrical readout electromagnet for providing a homogeneous magnetic field, wherein the readout magnet has a first plane and a second plane, wherein the readout magnet has at least 6 coils, and wherein the readout magnet is made according to the method of claim 3; and
   b) a polarizing magnet disposed such that a polarizing magnetic field is provided in the region of the homogeneous magnetic field.

24. The apparatus of claim 23 wherein the polarizing magnet is a solenoidal magnet disposed between the first plane and the second plane such that the polarizing magnetic field is perpendicular to the homogeneous magnetic field.

25. The apparatus of claim 23 wherein the polarizing magnet is a solenoidal magnet disposed between the first plane and the second plane such that the polarizing magnetic field is parallel to the homogeneous magnetic field.

26. The apparatus of claim 23 wherein the polarizing magnet is a solenoidal magnet disposed outside the first plane and second plane and wherein the polarizing magnet is coaxial with the readout magnet.

27. An apparatus for magnetic resonance imaging, comprising:
   a) a biplanar, symmetrical electromagnet made according to the method of claim 3 and having at least 6 coils for providing a homogeneous magnetic field;
   b) a gradient coil for providing gradient fields in the region of the homogeneous magnetic field;
   c) a radiofrequency coil for exciting nuclear spins in the region of the homogeneous magnetic field;
   d) a computerized console for controlling the gradient coil and radiofrequency coil.

28. A biplanar, symmetrical 6-coil electromagnet comprising:
   a) a first small coil;
   b) a first medium coil;
   c) a first large coil, wherein the first small coil, the first medium coil and the first large coil are located in a first plane;
   d) a second small coil;
   e) a second medium coil; and
   f) a second large coil, wherein the second small coil, the second medium coil, and the second large coil are located in a second plane;
   wherein:
   1) the first plane and the second plane are parallel and spaced apart by a distance 2z;
   2) all 6 coils are coaxial about an axis;
   3) the first small coil encloses a first small filamentary loop with a radius equal to 0.394771z to within 1%, and the second small coil encloses a second small filamentary loop with a radius equal to 0.394771z to within 1%;
   4) the first medium coil encloses a first medium filamentary loop with a radius equal to 0.858722z to within 1%, and the second medium coil encloses a second medium filamentary loop with a radius equal to 0.858722z to within 1%;
   5) the first large coil encloses a first large filamentary loop with a radius equal to 2.491120z to within 1%, and the second large coil encloses a second large filamentary loop with a radius equal to 2.491120z to within 1%;
   6) the first filamentary loops are coplanar with the first plane, and the second filamentary loops are coplanar with the second plane;
   whereby the electromagnet provides a homogeneous magnetic field between the first plane and second plane near the axis when energized with appropriate currents.

29. The electromagnet of claim 28, further comprising a means for energizing the coils with electrical currents such that:
   a) the first small coil and the second small coil each carry Ampere-turns equal to an arbitrary value $I_s$;
   b) the first medium coil and the second medium coil each carry Ampere-turns equal to $3.596420 I_s$ to within 1%; and
   c) the first large coil and the second large coil each carry Ampere-turns equal to $118.3143 I_s$ to within 1%.

30. The electromagnet of claim 28 further comprising a polarizing magnet for prepolarized magnetic resonance imaging, wherein the polarizing magnet is disposed such that a polarizing magnetic field is provided in the region of the homogeneous magnetic field.

31. The electromagnet of claim 28 wherein the coils are centered upon the corresponding filamentary loops.

32. The electromagnet of claim 28 wherein each coil has a cross-sectional dimensions less than 10% of the coils radius.

33. A biplanar, symmetrical 8-coil electromagnet comprising:
   a) a first small coil;
   b) a first medium coil;
   c) a first large coil;
   d) a first extra large coil, wherein the first small coil, the first medium coil, the first large coil, and the first extra large coil are located in a first plane;
   e) a second small coil;
   f) a second medium coil;
   g) a second large coil; and
   h) a second extra large coil, wherein the second small coil, the second medium coil, the second large coil, and the second extra large coil are located in a second plane;
   wherein:
      1) the first plane and the second plane are parallel and spaced apart by a distance 2z;
      2) all 8 coils are coaxial about an axis;
      3) the first small coil encloses a first small filamentary loop with a radius equal to 0.294922z to within 1%, and the second small coil encloses a second small filamentary loop with a radius equal to 0.294922z to within 1%;
      4) the first medium coil encloses a first medium filamentary loop with a radius equal to 0.590474z to within 1%, and the second medium coil encloses a second medium filamentary loop with a radius equal to 0.590474z to within 1%;
      5) the first large coil encloses a first large filamentary loop with a radius equal to 1.031283z to within 1%, and the second large coil encloses a second large filamentary loop with a radius equal to 1.031283z to within 1%;
      6) the first extra large coil encloses a first extra large filamentary loop with a radius equal to 2.632601z to within 1%, and the second extra large coil encloses a second extra large filamentary loop with a radius equal to 2.632601z to within 1%; and
      7) the first filamentary loops are coplanar with the first plane, and the second filamentary loops are coplanar with the second plane;
   whereby the electromagnet provides a homogeneous magnetic field between the first plane and second plane near the axis when energized with appropriate currents.

34. The electromagnet of claim 33 further comprising a means for energizing the coils with electrical currents such that:
   a) the first small coil and the second small coil each carry Ampere-turns equal to an arbitrary value $I_s$;
   b) the first medium coil and the second medium coil each carry Ampere-turns equal to $2.581089I_s$ to within 1%;
   c) the first large coil and the second large coil each carry Ampere-turns equal to $7.938104I_s$ to within 1%; and
   d) the first extra large coil and the second extra large coil each carry Ampere-turns equal to $233.1785I_s$ to within 1%.

35. The electromagnet of claim 33 further comprising a polarizing magnet for prepolarized magnetic resonance imaging, wherein the polarizing magnet is disposed such that a polarizing magnetic field is provided in the region of the homogeneous magnetic field.

36. The electromagnet of claim 33 wherein the coils are centered upon the corresponding filamentary loops.

37. The electromagnet of claim 33 wherein each coil has a cross-sectional dimensions less than 10% of the coils radius.

38. A biplanar, symmetrical 10-coil electromagnet comprising:
   a) a first extra small coil
   b) a first small coil;
   c) a first medium coil;
   d) a first large coil;
   e) a first extra large coil, wherein the first extra small coil, the first small coil, the first medium coil, the first large coil, and the first extra large coil are located in a first plane;
   f) a second extra small coil;
   g) a second small coil;
   h) a second medium coil;
   i) a second large coil; and
   j) a second extra large coil, wherein the second extra small coil, the second small coil, the second medium coil, the second large coil, and the second extra large coil are located in a second plane;
   wherein:
      1) the first plane and the second plane are parallel and spaced apart by a distance 2z;
      2) all 10 coils are coaxial about an axis;
      3) the first extra small coil encloses a first extra small filamentary loop with a radius equal to 0.236199z to within 1%, and the second extra small coil encloses a second extra small filamentary loop with a radius equal to 0.236199z to within 1%;
      4) the first small coil encloses a first small filamentary loop with a radius equal to 0.457269z to within 1%, and the second small coil encloses a second small filamentary loop with a radius equal to 0.457269z to within 1%;
      5) the first medium coil encloses a first medium filamentary loop with a radius equal to 0.734885z to within 1%, and the second medium coil encloses a second medium filamentary loop with a radius equal to 0.734885z to within 1%;
      6) the first large coil encloses a first large filamentary loop with a radius equal to 1.164685z to within 1%, and the second large coil encloses a second large filamentary loop with a radius equal to 1.164685z to within 1%;
      7) the first extra large coil encloses a first extra large filamentary loop with a radius equal to 2.745650z to within 1%, and the second extra large coil encloses a second extra large filamentary loop with a radius equal to 2.745650z to within 1%; and
      8) the first filamentary loops are coplanar with the first plane, and the second filamentary loops are coplanar with the second plane;
   whereby the electromagnet provides a homogeneous magnetic field between the first plane and second plane near the axis when energized with appropriate currents.

39. The electromagnet of claim 38 further comprising a means for energizing the coils with electrical currents such that:

a) the first extra small coil and the second extra small coil each carry Ampere-turns equal to an arbitrary value $I_s$;

b) the first medium coil and the second medium coil each carry Ampere-turns equal to $2.255341 I_s$ to within 1%;

c) the first medium coil and the second medium coil each carry Ampere-turns equal to $4.938906 I_s$ to within 1%;

d) the first large coil and the second large coil each carry Ampere-turns equal to $14.159399 I_s$ to within 1%; and e) the first extra large coil and the second extra large coil each carry Ampere-turns equal to $386.32597 I_s$ to within 1%.

40. The electromagnet of claim 38 further comprising a polarizing magnet for prepolarized magnetic resonance imaging, wherein the polarizing magnet is disposed such that a polarizing magnetic field is provided in the region of the homogeneous magnetic field.

41. The electromagnet of claim 38 wherein the coils are centered upon the corresponding filamentary loops.

42. The electromagnet of claim 38 wherein each coil has a cross-sectional dimensions less than 10% of the coils radius.

43. A biplanar, symmetrical 6-coil electromagnet comprising:

a) a first small coil;

b) a first medium coil;

c) a first large coil, wherein the first small coil, the first medium coil and the first large coil are located in a first plane;

d) a second small coil;

e) a second medium coil; and f) a second large coil, wherein the second small coil, the second medium coil, and the second large coil are located in a second plane;

wherein:

1) the first plane and the second plane are parallel and spaced apart by a distance 2z;

2) all 6 coils are coaxial about an axis;

3) the first small coil encloses a first small filamentary loop with a radius equal to 0.719325z to within 1%, and the second small coil encloses a second small filamentary loop with a radius equal to 0.719325z to within 1%;

4) the first medium coil encloses a first medium filamentary loop with a radius equal to 1.189337z to within 1%, and the second medium coil encloses a second medium filamentary loop with a radius equal to 1.189337z to within 1%;

5) the first large coil encloses a first large filamentary loop with a radius equal to 1.950000z to within 1%, and the second large coil encloses a second large filamentary loop with a radius equal to 1.950000z to within 1%;

6) the first filamentary loops are coplanar with the first plane, and the second filamentary loops are coplanar with the second plane;

whereby the electromagnet provides a homogeneous magnetic field between the first plane and second plane near the axis when energized with appropriate currents.

44. The electromagnet of claim 43 further comprising a means for energizing the coils with electrical currents such that:

a) the first small coil and the second small coil each carry Ampere-turns equal to an arbitrary value $I_s$;

b) the first medium coil and the second medium coil each carry Ampere-turns equal to $-2.893504 I_s$ to within 1%; and c) the first large coil and the second large coil each carry Ampere-turns equal to $21.051452 I_s$ to within 1%.

45. The electromagnet of claim 43 further comprising a polarizing magnet for prepolarized magnetic resonance imaging, wherein the polarizing magnet is disposed such that a polarizing magnetic field is provided in the region of the homogeneous magnetic field.

46. The electromagnet of claim 43 wherein the coils are centered upon the corresponding filamentary loops.

47. The electromagnet of claim 43 wherein each coil has a cross-sectional dimensions less than 10% of the coils radius.

* * * * *